United States Patent [19]
Watanabe

[11] Patent Number: 6,137,733
[45] Date of Patent: Oct. 24, 2000

[54] BOOSTING CIRCUIT USING 2-STEP BOOSTING OPERATION

[75] Inventor: Kazuo Watanabe, Tokyo, Japan

[73] Assignee: NEC Corporation, Tokyo, Japan

[21] Appl. No.: 09/411,365

[22] Filed: Oct. 4, 1999

[30] Foreign Application Priority Data

Oct. 5, 1998 [JP] Japan .................... 10-282857

[51] Int. Cl.$^7$ .................................................. G11C 16/04
[52] U.S. Cl. ...................... 365/189.09; 365/226
[58] Field of Search .................. 365/189.09, 226, 365/189.11, 230.06

[56] References Cited

U.S. PATENT DOCUMENTS

| | | | |
|---|---|---|---|
| 5,406,523 | 4/1995 | Foss et al. | 365/226 |
| 5,623,446 | 4/1997 | Hisada et al. | 365/189.11 |
| 5,828,620 | 10/1998 | Foss et al. | 365/226 |
| 5,940,333 | 8/1999 | Chung | 365/189.09 |

FOREIGN PATENT DOCUMENTS

| | | |
|---|---|---|
| 56-111179 | 9/1981 | Japan . |
| 63-139426 | 6/1988 | Japan . |
| 5-189970 | 7/1993 | Japan . |
| 07-287993 | 10/1995 | Japan . |
| 9-139077 | 5/1997 | Japan . |
| 9-191093 | 7/1997 | Japan . |

*Primary Examiner*—Richard Elms
*Assistant Examiner*—Anh Phung
*Attorney, Agent, or Firm*—Sughrue, Mion, Zinn, Macpeak & Seas, PLLC

[57] ABSTRACT

A semiconductor memory device with a boosting circuit includes a first power supply line, a second power supply line supplying a power supply potential, first and second boosting capacitors connected to the first power supply line, and a control circuit. The control circuit connects the second power supply line to the first power supply line for a first time interval such that the first power supply line and the first and second boosting capacitors, boosts the first power supply line and the second boosting capacitor by the first boosting capacitor for a second time interval after the first time interval, and boosts the first power supply line by the second boosting capacitor for a third time interval after the second time interval.

15 Claims, 6 Drawing Sheets

Fig. 1 PRIOR ART
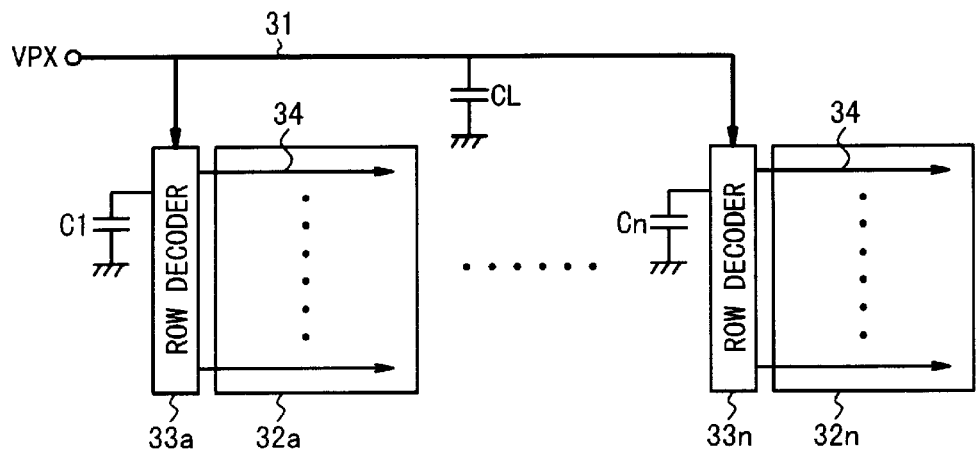
Fig. 2 PRIOR ART
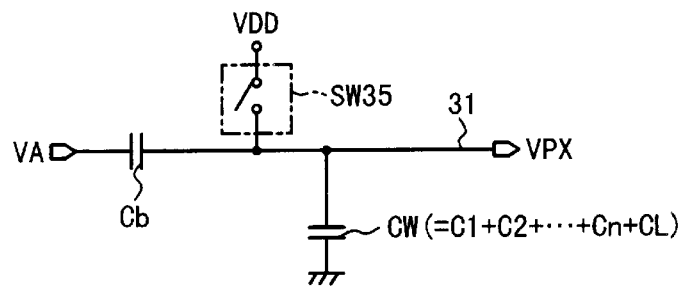
Fig. 3A PRIOR ART
Fig. 3B PRIOR ART
Fig. 3C PRIOR ART
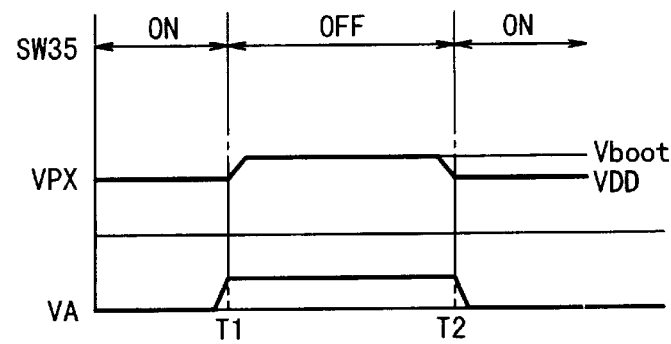

Fig. 4
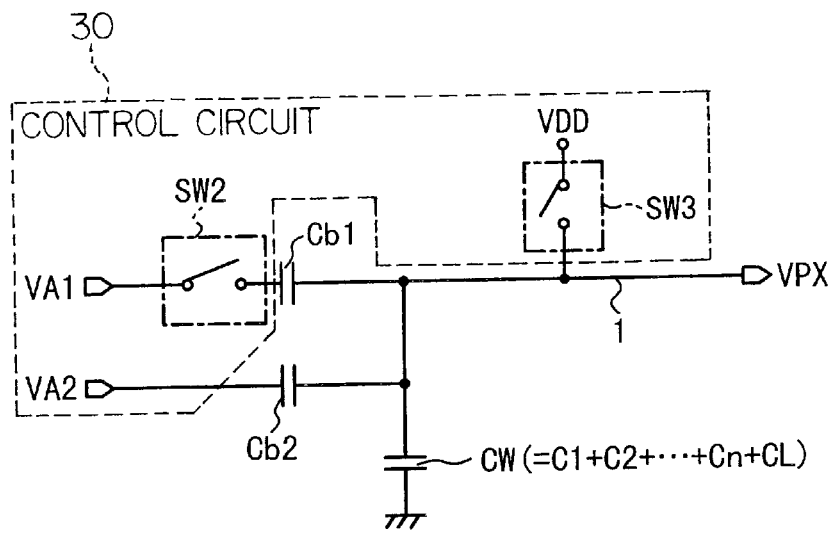
Fig. 5A
Fig. 5B
Fig. 5C
Fig. 5D
Fig. 5E
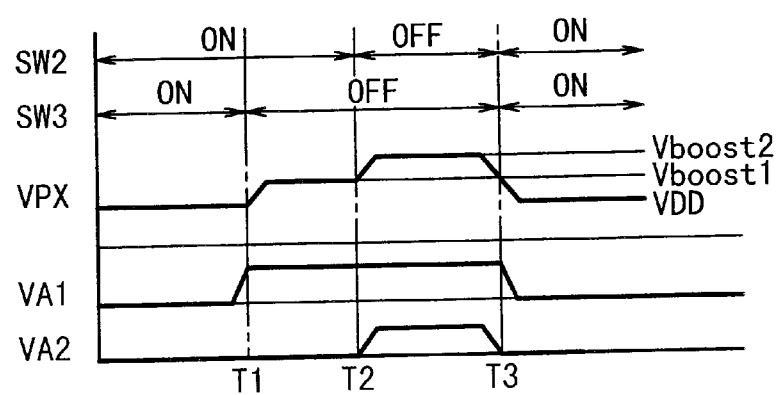

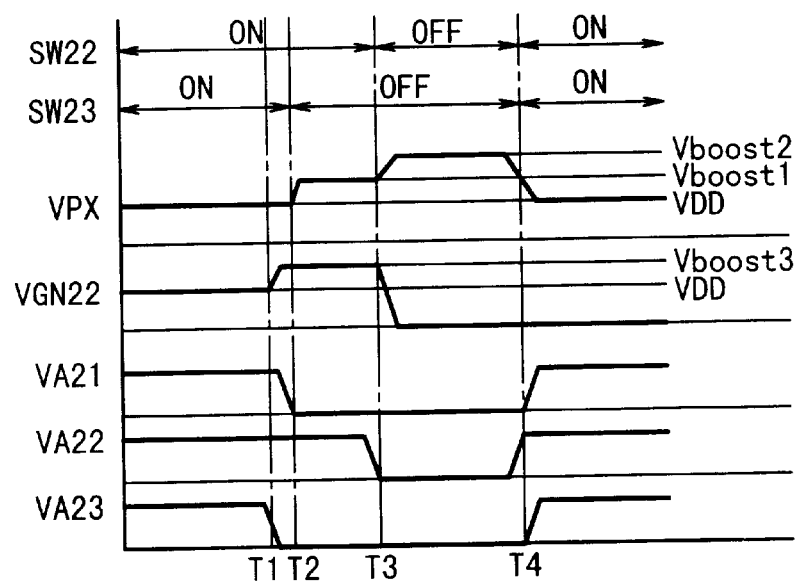
Fig. 9A SW22
Fig. 9B SW23
Fig. 9C VPX
Fig. 9D VGN22
Fig. 9E VA21
Fig. 9F VA22
Fig. 9G VA23

BOOSTING CIRCUIT USING 2-STEP BOOSTING OPERATION

BACKGROUND OF THE INVENTION

1. Field of the Invention

The present invention relates to a semiconductor device with a boosting circuit sing a 2-step boosting operation.

2. Description of the Related Art

FIG. 1 is a block diagram showing the structure of a row decoder in a cell array block of a usual semiconductor memory device. A plurality of row decoders 33a to 33n are connected with a row system power supply line 31 which is connected with a row decoder power supply VPX. A plurality of word lines 34 extend from each of the row decoders 33a to 33n to a corresponding one of memory cell arrays 32a to 32n.

In a semiconductor memory such as a FLASH memory are required various criteria such as low voltage operation, low power consumption, high access speed and cost reduction through chip size reduction. Under these criteria, the power supply voltage becomes low. However, it is difficult to decrease a threshold voltage (hereinafter, to be referred to as Vtm) of a cell.

There are coupling capacitance between a word line, a floating gate and a substrate containing diffusion layers in one memory cell. A writing system by use of channel hot electrons is generally adopted in a NOR type cell array 32 in which a plurality of memory cell are connected with a same bit line. In this case, the potential of the floating gate is increased due to the drain voltage in the non-selected memory cell on the same bit line in a memory cell writing operation, so that a leak current flows. The leak current changes based on the threshold voltage Vtm of the cell, the leak quantity increases in a low threshold voltage Vtm.

Also, leak currents of the cells connected to the same bit line are added for the number of cells. Consequently, the write drain potential drops so that it becomes impossible to perform the write operation. Accordingly, the minimum of on cell threshold voltage Vtm must be suppressed to about 1 V. Also, the deviation of threshold voltages Vtm of the memory cells in case of erasure is about 1 V. In consideration of the above matters, the upper limit of the threshold voltage Vtm is 2 V. If the threshold voltage is lower than 2 V, there is the possibility that the memory cell cannot be turned on, even if a power supply potential is applied to a word line.

Also, to speed up the memory device, the on current of the memory cell must be increased. Therefore, the word potential as many as about 3.5 V is required.

Therefore, it is necessary to increase the word potential at the time of the reading operation. As the technique of increasing the word potential, there are a charge pump system in which the word potential is increased by a charge pump, and a voltage boosting system in which the word potential is increased through the voltage boosting by use of capacitance coupling.

In case of the charge pump system, the charge pump must be always operated before the reading operation so as to increase the word potential. Therefore, this method cannot achieve the low power consumption. Also, when the current is set to 0 μA at a standby mode, several μs is required to switch the operation mode from the standby mode to a boosting mode. Therefore, the charge pump does not meet the high-speed operation. Further, if the current is increased to realize the high-speed switching, the charge pump does not meet the low power consumption criteria.

In case of the voltage boosting method, the boosting capacitor is provided to boost the word line connected to the word line power supply line to a potential higher than a power supply potential VDD. Only when the word line potential should be increased, the potential of one electrode of the boosting capacitor is increased from the ground (GND) potential to the power supply potential VDD so that it is possible to increase the word line potential at high speed. Therefore, a voltage boosting circuit needs not to always operate at the time of access. Thus, the consumption current can be reduced at the time of access and can be set to 0 μA in the standby mode. In this method, however, there is a limitation in the maximum voltage capable of being outputted to the word line.

FIG. 2 is a schematic circuit diagram showing the principle of a conventional example of the boosting circuit. FIGS. 3A to 3C are timing charts in various portions of the boosting circuit shown in FIG. 2.

Referring to FIG. 2, one of the electrodes of the boosting capacitor Cb is connected with the row decoder power supply VPX and the other electrode is connected with the power supply VA. Also, the external power supply potential VDD is connected with the row decoder power supply VPX through the switch 35. As shown in FIG. 2, in the row system power supply line 31 is a parasitic capacitor CW which is a total of a parasitic capacitance CL of the row system power supply line 31 itself and parasitic capacitances C1 to Cn of the row decoders 33a to 33n.

Supposing that the power supply potential is VDD(V), the boosting capacitor is Cb (pF), and the parasitic capacitor connected with the word line power supply potential VPX is Cw(pF), the word line potential Vword is expressed by the following equation:

$$Vword=\{(2 \times Cb+Cw) \div (Cb+Cw)\} \times VDD$$

Theoretically, the word line potential can be increased to twice of the potential of VDD if the capacitor Cb is increased to an infinite value. However, from the viewpoint of the reduction of a chip size, the boosting capacitor is desired to be as small as possible. In case of that the power supply voltage Vdd is 1.8 V, the parasitic capacitance Cw is 100 pF, and the row decoder power supply VPX potential is 3.5 V, the boosting capacitor needs to have the capacitance equal to or more than 1500 pF, in the relation between the above-mentioned potential and capacitance. When a lower voltage power supply is used, the boosting capacitor Cb needs to have a further larger capacitance. This leads the increase of chip size. Alternatively, when the power supply voltage Vdd is 1.8 V, the parasitic capacitance Cw is 100 pF, and the boosting capacitor Cb is 1500 pF, the row decoder power supply VPX potential is 3.488 V.

In conjunction with the above description, a semiconductor memory device is disclosed in Japanese Laid Open Patent Application (JP-A-Showa 56-111179). In this reference, a word line is driven by a row decoder which generates a first high voltage based on a row address signal. After the first high voltage is generated, a voltage reducing unit reduces the voltage from the first high voltage to a second high voltage with a time constant. Thus, when an address signal is switched, the voltage can be reduced quickly.

Also, a boosting circuit is disclosed in Japanese Laid Open Patent Application (JP-A-Showa 63-139426). In this reference, the boosting circuit is composed of first to third MOS transistors and a capacitor. The first MOS transistor is connected at one electrode to a power supply line. The second MOS transistor has one electrode connected to a first input terminal, the other electrode connected to a gate electrode of the first MOS transistor, and a gate electrode connected to the power supply line. The third MOS transistor has one electrode connected to the other electrode of the first MOS transistor, the other electrode connected to a ground potential, and a gate electrode connected to a second input terminal. The capacitor is connected at one electrode to a node between the gate electrode of the first MOS transistor and the other electrode of the second MOS transistor. Also, the capacitor is connected at the other electrode to a node between the other electrode of the first MOS transistor and one electrode of the third MOS transistor. A resistor is interposed between the one electrode of the first MOS transistor and the power supply line or the other electrode of the first MOS transistor and the one electrode of the third MOS transistor.

Also, a boosting circuit is disclosed in Japanese Laid Open Patent Application (JP-A-Heisei 5-189970). In this reference, the boosting circuit is composed of boosting capacitors C1 to C4. The boosting capacitors C1 to C4 are connected substantially in parallel to be charged to a predetermined potential when a control signal S1 is in a low level. Also, the boosting capacitors C1 to C4 are connected substantially in series to be boosted when the control signal S1 is in a high level. The boosting circuit is further composed of a boosting capacitor C5 and MOSFETs Q5 and Q6. The gate voltages of MOSFET Q1 to Q4 for charging the boosting capacitors C1 to C4 based on a control signal S2 which is made effective prior to the control signal S1.

Also, a 2-stage boosting circuit is disclosed in Japanese Laid Open Patent Application (JP-A-Heisei 9-139077). In this reference, the boosting circuit is composed of a low voltage power supply Vcc, a high voltage power supply Vch, a NMOS transistor QN1 and a PMOS transistor QN2. The output of the NMOS transistor QN1 driven from 0 V to (Vcc−Vth) in response to a pre-boost signal IN1. The output of the PMOS transistor QN2 driven from the (Vcc−Vth) to the high voltage Vch in response to a pre-boost signal IN2.

Also, a word line driving method is disclosed in Japanese Laid Open Patent Application (JP-A-Heisei 9-191093). In this reference, a word line enable signal is generated from a part of an address signal by a main row decoder. A word line boosting signal is generated from another part of the address signal by a sub row decoder. A boosting element transfers the word line enable signal to a boost node via a first power supply voltage source. A high voltage transfer means input a potential of the boost node and transfers the word line boosting signal to a word line. After the word line enable is switched from the low level to the high level, the word line boosting signal is switched from the ground potential to a high potential such that the word line is driven. Thereafter, the first power supply voltage source changes from a high potential state to a low potential state.

SUMMARY OF THE INVENTION

Therefore, an object of the present invention is to provide a boosting circuit in which low power consumption, high-speed access can be realized with boosting capacitors with few capacitances in a low cost.

In order to achieve an aspect of the present invention, a semiconductor memory device with a boosting circuit includes a first power supply line, a second power supply line supplying a power supply potential, first and second boosting capacitors connected to the first power supply line, and a control circuit. The control circuit connects the second power supply line to the first power supply line for a first time interval such that the first power supply line and the first and second boosting capacitors, boosts the first power supply line and the second boosting capacitor by the first boosting capacitor for a second time interval after the first time interval, and boosts the first power supply line by the second boosting capacitor for a third time interval after the second time interval.

Here, the control circuit may include a first switch provided between the first power supply line and the second power supply line. At this time, the control circuit controls the first switch to connect the second power supply line to the first power supply line for the first time interval.

Also, the control circuit may include a second switch provided between the first boosting capacitor and a first node. At this time, the control circuit controls the second switch to connect the first boosting capacitor to the first node for the first and second time intervals, to disconnect the first boosting capacitor from the first node for the third time interval. Also, the control circuit sets the first node to a ground potential for the first time interval, and to the power supply potential for the second time interval.

Also, the control circuit includes a second node connected to the second boosting capacitor. At this time, the control circuit sets the second node to a ground potential for the first and second time intervals and to the power supply potential for the third time interval.

Otherwise, the control circuit may include a control signal generating circuit, a first switching element and a first signal generating circuit. The control signal generating circuit generates a first control signal. The first switching element connects between the first and second power supply lines in response to a first switching signal. The first signal generating circuit generates the first switching signal in response to the first control signal such that the first switching signal is active for the first time interval. In this case, the first signal generating circuit is preferably connected to the first power supply line as a power supply line. Also, the first signal generating circuit preferably includes a flip-flop circuit.

Also, in this case, the control circuit may include a first inverter connected at its output to the second boosting capacitor. The control signal generating circuit generates a second control signal which is set to the power supply potential for the third time interval and supplies the second control signal to an input of the first inverter.

Also, the control circuit may include a second inverter with a second switch element and a second signal generating circuit. An output of the second inverter is connected to the first boosting capacitor, and the second switching element is switched in response to a second switching signal to connect the output of the second inverter to the power supply potential. The second signal generating circuit generates the second switching signal in response to the second control signal such that the second switching signal is active for the second and third time intervals. The control circuit supplies the first control signal to an input of the second inverter. In this case, the second generating circuit is preferably connected to the first power supply line as a power supply line. Also, the second generating circuit includes a flip-flop circuit.

Also, when the control signal generating circuit generates a third control signal, the second signal generating circuit may include a third power supply line, a charging circuit and a third signal generating circuit. The charging circuit charges the third power supply line higher than the power supply potential for a fourth time interval of the first time interval immediately before the second time interval in response to the third control signal. The third signal generating circuit is connected to the third power supply line, and generates the second switching signal in response to the second control signal such that the second switching signal is active for the second and third time intervals. In this case, the third generating circuit includes a flip-flop circuit.

Also, the charging circuit preferably includes a third boosting capacitor, a third switching element, a third inverter and a fourth signal generating circuit. The third boosting capacitor is connected to the third power supply line. The third switching element connects the second power supply line to the third power supply line in response to a third switching signal. The third inverter is connected at an output to the third boosting capacitor, and drives the third boosting capacitor in response to the third control signal such that the third power supply line higher is boosted than the power supply potential for the fourth, second and third time intervals. The fourth signal generating circuit is connected to the third power supply line, and generates the third switching signal in response to the third control signal such that the third switching signal is active for the first time interval other than the fourth time interval.

In order to achieve another aspect of the present invention, a method of boosting a voltage, includes:

charging a first power supply line and first and second boosting capacitors from a second power supply line for a first time interval;

charging the first power supply line and the second boosting capacitor by the first boosting capacitor for a second time interval after the first time interval;

operatively disconnecting the first boosting capacitor; and charging the first power supply line by the second boosting capacitor for a third time interval after the second time interval.

BRIEF DESCRIPTION OF THE DRAWINGS

FIG. 1 is a block diagram showing the structure of a conventional semiconductor memory device composed of row decoders and memory cell array blocks;

FIG. 2 is a schematic diagram showing the principle of a boosting operation in a conventional example of a boosting circuit of the conventional semiconductor memory device;

FIGS. 3A to 3C are timing charts in the boosting circuit shown in FIG. 2;

FIG. 4 is a schematic diagram showing the principle of a boosting operation in a boosting circuit according to a first embodiment of the present invention;

FIGS. 5A to 5E are timing charts in the boosting circuit according to the first embodiment of the present invention;

FIGS. 9A to 9G are timing charts in the boosting circuit according to the third embodiment of the present invention.

DESCRIPTION OF THE PREFERRED EMBODIMENTS

Figure 6:
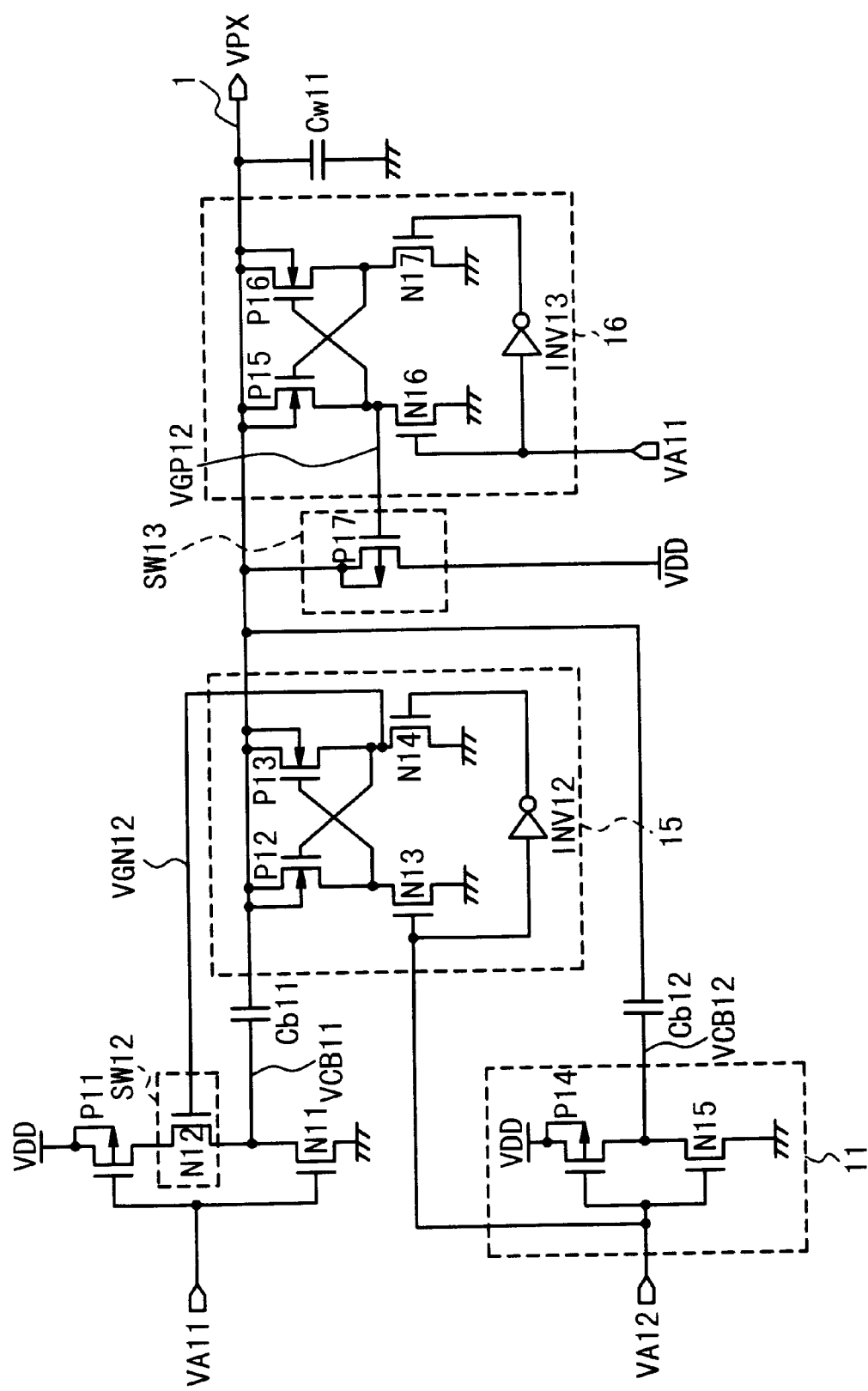
FIG. 6 is a schematic circuit diagram showing the structure of the boosting circuit according to a second embodiment of the present invention.

Next, a semiconductor memory device with a boosting circuit of a semiconductor memory device of the present invention will be described below in detail with reference to the attached drawings.

FIG. 4 is a schematic circuit diagram showing the operation principle of the boosting circuit according to the first embodiment of the present invention. FIGS. 5A to 5E are the timing charts at various portions of the boosting circuit shown in FIG. 4.

Referring to FIG. 4, the boosting circuit in the first embodiment is composed of boosting capacitors Cb1 and Cb2, the switches 2 and 3, and a control circuit 30 controlling the potential of the nodes VA1 and VA2. One of the electrodes of each of the boosting capacitors Cb1 and Cb2 is connected with a row decoder power supply line 1. Thus, the boosting capacitors Cb1 and Cb2 are connected in parallel to the power supply line 1. The other electrode of the boosting capacitor Cb1 is connected with a node VA1 through the switch 2 and the other electrode of the boosting capacitor Cb2 is connected directly with a node VA2. Also, the row decoder power supply line 1 is connected with an external power supply line VDD through the switch 3.

A parasitic capacitance Cw is present to the row decoder power supply line 1. Referring to FIG. 1, the row system power supply line 31 is connected with the row decoder power supply line 1 and is connected with the plurality of row decoders 33a to 33n. The row decoders 33a to 33n have parasitic capacitors C1 to Cn. Also, the wiring capacitors CL of the row decoder power supply line 1 is added as a part of the parasitic capacitance. Therefore, a total parasitic capacitance Cw of the row decoder power supply line 1 is expressed as follows:

$$Cw = C1 + \ldots + Cn + CL.$$

Next, a voltage boosting operation of the boosting circuit will be described.

The switch 3 is turned off at the first timing t1 to disconnect the row decoder power supply line 1 from the external power supply line VDD. The switch 2 for the boosting capacitor Cb1 is remained in the on state. In this state, the node VA1 is changed from the GND potential to the power supply potential VDD. Thus, the first potential higher than the power supply potential VDD is attained on the row decoder power supply line 1. The switch 2 is turned off at the second timing t2. Thus, the node VA2 is switched in potential from the GND potential to the power supply potential VDD. As a result, the second potential higher than the first potential which has been attained at the first timing is attained on the row decoder power supply line 1.

This operation will be described more in detail with reference to FIGS. 5A to 5E.

Before the timing t1 in FIGS. 5D and 5E, the switches 2 and 3 are turned on. Because the switch 2 is turned on, the one electrode of the boosting capacitor Cb1 is sets to the conductive state with the node VA1 being held to the GND potential. Also, one electrode of the boosting capacitor Cb2 is set to the conductive state with the node VA2 being held to the GND potential. Moreover, because the switch 3 is turned on, the row decoder power supply line 1 and the external power supply line VDD are in the conductive state so that the row decoder power supply line 1 potential VPX is pulled up to the external power supply line potential VDD. Also, the electric charge of (VDD×Cb1) is stored in the boosting capacitor Cb1, and the electric charge of (VDD× Cb2) is stored in the boosting capacitor Cb2. In addition, the electric charge of (VDD×Cw) is stored in the parasitic capacitor Cw. Therefore, a total electric charge quantity Qt is expressed as follows:

$$Qt=VDD\times(Cb1+Cb2+Cw)$$

Next, at the timing t1 shown in FIG. 5D, the potential at the node VA1 is increased from the GND potential to the external power supply line potential VDD. At the same time, the switch 3 is turned off. As a result, the potential VPX of the row decoder power supply line 1 is increased from the external power supply potential VDD level to the potential of Vboost1. Because the total electric charge quantity is same, $$Qt=(Vboost1-VDD)\times Cb1+Vboost1\times(Cb2+Cw)$$

Thus, for the time interval from the timing t1 to the timing t2 in FIGS. 5A to 5C, the potential VPX of the row decoder power supply line 1 is increased as follows:

$$Vboost1=\{(2\times Cb1+Cb2+Cw)\div(Cb1+Cb2+Cw)\times VDD\}=VDD\{1+Cb1\div(Cb1+Cb2+Cw)\}$$

Next, at the timing t2 shown in FIG. 5A, the potential at the node VA2 is increased from the GND potential to the external power supply line potential VDD. At the same time, the switch 2 is turned off. As a result, the potential VPX of the row decoder power supply line 1 is further increased from the potential Vboost1 to the potential Vboost2.

The switch 2 is turned off, so that the electrode of the boosting capacitor Cb1 is set to the high impedance. Consequently, the capacitor Cb1 is in a floating state. In this case, because the total electric charge quantity Qt is also same, $$Qt=(Vboost2-VDD)\times Cb2+Vboost2\times Cw+(Vboost1-VDD)\times Cb1$$

For the time interval from the timing t2 to the timing t3 in FIG. 5A, the potential VPX of the row decoder power supply line 1 is increases to the potential Vboost2:

$$Vboost2=\{Vboost1+Cb2\div(Cb2+Cw)\times VDD\}$$

After the timing t3, all the switches SW2 and SW3 and all the nodes are reset to the states before the timing t1.

Next, the second embodiment of the present invention will be described with reference to a specific circuit. FIG. 6 is a schematic diagram showing the structure of the boosting circuit according to the second embodiment of the present invention. FIGS. 7A to 7F are waveforms of various sections of the boosting circuit shown in FIG. 6.

In FIG. 6, P11 to P17 are P-channel MOS transistors. N11 and N13 to N17 are N-channel MOS transistors. N12 is a non-doped N-channel MOS transistor. INV12 and INV13 are inverters. Cb11 is a first boosting capacitor, and Cb12 is a second boosting capacitor. Cw11 is a parasitic capacitance that is parasitic on the row decoder power supply line 1, as above-mentioned. The boosting circuit in the second embodiment is composed of a control unit (not shown) controlling the potentials of the signals VA11 and VA12.

The level shifter 15 is composed of the MOS transistors P12, P13, N13 and N14 and the inverter INV12, and is a voltage converting circuit which has the potential of the row decoder power supply line 1 as the power supply potential. the level shifter 15 has VGN12 as an output signal and VA12 as an input signal. A level shifter 16 is composed of the MOS transistors P15, P16, N16 and N17, and the inverter INV13 and is a voltage converting circuit which has the potential VPX of the row decoder power supply line 1 as the power supply potential. The level shifter 16 has VGP12 as an output signal and VA11 as an input signal. An inverter 11 is composed of the MOS transistors P14 and N15. The inverter 11 has the external power supply potential VDD as the power supply potential, VA12 as the input signal, and VCB12 as an output signal. The inverters INV12 and INV13 are composed of the N-channel transistor and the P-channel transistor which use the external power supply line potential VDD as the power supply potential, as in the case of the inverter 11.

The switch 12 is composed of the undoped N-channel MOS transistor N12 and is equivalent to the switch 2 shown in FIG. 4. The source of the MOS transistor N12 is connected with the drain of the N-channel MOS transistor N11 as a node VCB11, and the drain thereof is connected with the drain of the P-channel MOS transistor P11. The switch 12 is controlled in response to the output signal VGN12 of the level shifter 15. The source of the MOS transistor N11 is connected with the GND and the N11 is controlled in response to the signal VA11. The source of the P-channel MOS transistor P11 is connected with the external power supply line VDD and the MOS transistor P11 is controlled in response to the signal VA11.

The switch 13 is composed of the MOS transistor P17 and is equivalent to the switch 3 shown in FIG. 4. The source of the MOS transistor P17 is connected with the external power supply potential VDD, and the drain thereof is connected with the row decoder power supply line 1. The switch 13 is controlled in response to the output signal VGP12 of the level shifter 16.

The boosting capacitors Cb11 and Cb12 are equivalent to the boosting capacitors Cb1 and Cb2 shown in FIG. 4. The electrodes of the boosting capacitors Cb11 and Cb12 are connected with the row decoder power supply line 1 in parallel and the other electrodes of Cb11 is connected with the node VCB11. The other electrode of Cb12 is connected with the output node VCB12 of the inverter 11.

The operation of the boosting circuit in the second embodiment will be described with reference to FIG. 6 and FIGS. 7A to 7F.

Figure 7:
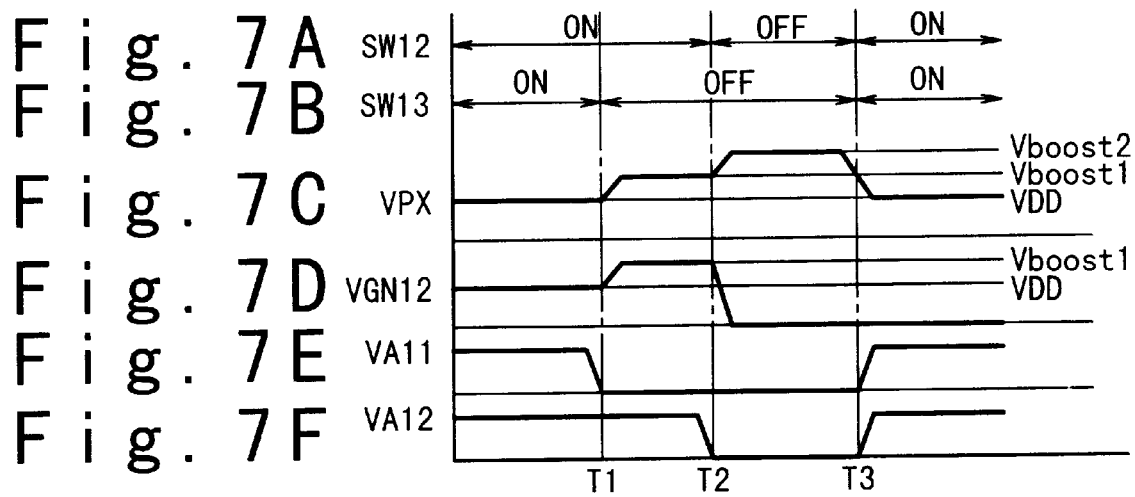
FIGS. 7A to 7F are timing charts in the boosting circuit according to the second embodiment of the present invention.

As shown in FIGS. 7E and 7F, the signals VA11 and VA12 are held at the high level before the timing t1. Therefore, because the gates of the N-channel transistor N11 and P-channel MOS transistor P11 are set to the high level, the MOS transistor P11 is turned off and the MOS transistor N11 is turned on. Therefore, the one electrode of the boosting capacitor Cb11 is set to the GND potential through the node VCB11 and the MOS transistor N11. Also, because the gates of the N-channel MOS transistor N15 and P-channel MOS transistor P14 are set to the high level, the MOS transistor P14 is turned off and the MOS transistor N15 is turned on. As a result, the one electrode of the boosting capacitor Cb12 is set to the GND potential through the node VCB12 and the MOS transistor N15.

The signal VA11 is supplied to the input of the level shifter 16. Because the signal VA11 is in the high level, the GND potential of the inverse logic level is outputted as the output signal VGP12. Thus, the gate of the MOS transistor P17 of the switch 13 is set to the GND potential, so that the MOS transistor P17 is turned on and the row decoder power supply line 1 is set to the conductive state with the external power supply line VDD.

The signal VA12 is supplied to the input of the level shifter 15. Because the signal VA12 is set to the high level, the row decoder power supply line potential VPX having the same phase as the signal VA12 is outputted as the signal VGN12. Because the row decoder power supply line potential VPX is set to the conductive state with the external power supply line potential VDD, the external power supply line potential VDD is outputted as the signal VGN12. Thus, the electric charge of (VDD×Cb11) is stored in the boosting capacitor Cb11, and the electric charge of (VDD×Cb12) is stored in the boosting capacitor Cb12. In addition, the electric charge of (VDD×Cw11) is stored in the parasitic capacitor Cw11. Therefore, a total electric charge quantity Qt is as follows:

$$Qt=\{VDD\times(Cb11+Cb12+Cw11)\}$$

When the signal VA11 is switched from the high level to the GND level at the timing t1 shown in FIG. 7E, the GND potential is supplied to the input of the level shifter 16. The row decoder power supply potential VPX having the inverse phase to the signal VA11 is outputted as the output signal VGP12. Because the gate of the MOS transistor P17 of the switch 13 is set to the potential VPX, the MOS transistor P17 is turned off so that the row decoder power supply line 1 is disconnected from the external power supply potential VDD and becomes a high impedance state.

At the same time, the MOS transistor N11 is turned off and the MOS transistor P11 is turned on. Therefore, the node VCB11 is increased to the potential (VDD−Vth) (Vth is a threshold voltage of the undoped MOS transistor N12) because the signal VGN12 in the high level is applied to the MOS transistor N12. Because the potential of the node VCB11 is increased, the potential VPX of the row decoder power supply line 1 is also increased as the potential of the node VCB11 is increased.

Because the signal VA12 in the high level is supplied to the input of the level shifter 15, the row decoder power supply potential VPX having the same logic phase as the signal VA12 is outputted as the output signal VGN12. Because the row decoder power supply potential VPX is increased as the node VCB11 potential is increased, the potential level of the signal VGN12 is also increased. As a result, the gate of the undoped MOS transistor N12 becomes the level which is higher than the external power supply potential VDD. Therefore, the node VCB11 potential is increased to the external power supply potential VDD. Finally, the row decoder power supply line potential VPX is increased to the potential of Vboost1. Because the total charge quantity Qt is same, the total electric charge quantity Qt is as follows:

$$Qt=(Vboost1-VDD)\times Cb11+Vboost1\times(Cb12+Cw11)$$

For the time interval from t1 to t2 in FIG. 7C, the row decoder power supply line potential VPX is increased to the potential level shown by the following equation.

$$Vboost1=\{(2\times Cb11+Cb12+Cw11)\div(Cb11+Cb12+Cw11)\times VDD\}$$

Next, when the signal VA12 is switched from the high level to the GND potential at the timing of t2 shown in FIG. 7F, the GND potential is supplied to the input of the level shifter 15 and the GND potential having the same logic phase as the signal VA12 is outputted as the output signal VGN12. Because the gate of the undoped MOS transistor N12 is set to the GND potential, the node VCB11 is set to a high impedance state. The signal VA12 is switched from the high level to the GND potential in the state so that the output node VCB12 of the inverter 11 is switched from the GND potential to the external power supply potential VDD level. As a result, the row decoder power supply line potential VPX is further increased from the Vboost1 level to the Vboost2 level. The total electric charge quantity Qt in this case is as follows:

$$Qt=(Vboost2-VDD)\times Cb12+Vboost2\times Cw11+(Vboost1-VDD)\times Cb11$$

The row decoder power supply line potential VPX for the time interval from t2 to t3 in FIG. 7C is increased to the level shown by the following equation:

$$Vboost2=\{Vboost1+Cb12\div(Cb12+Cw11)\times VDD\}$$

Next, the third embodiment of the present invention will be described with reference to a specific circuit as an example.

Figure 8:
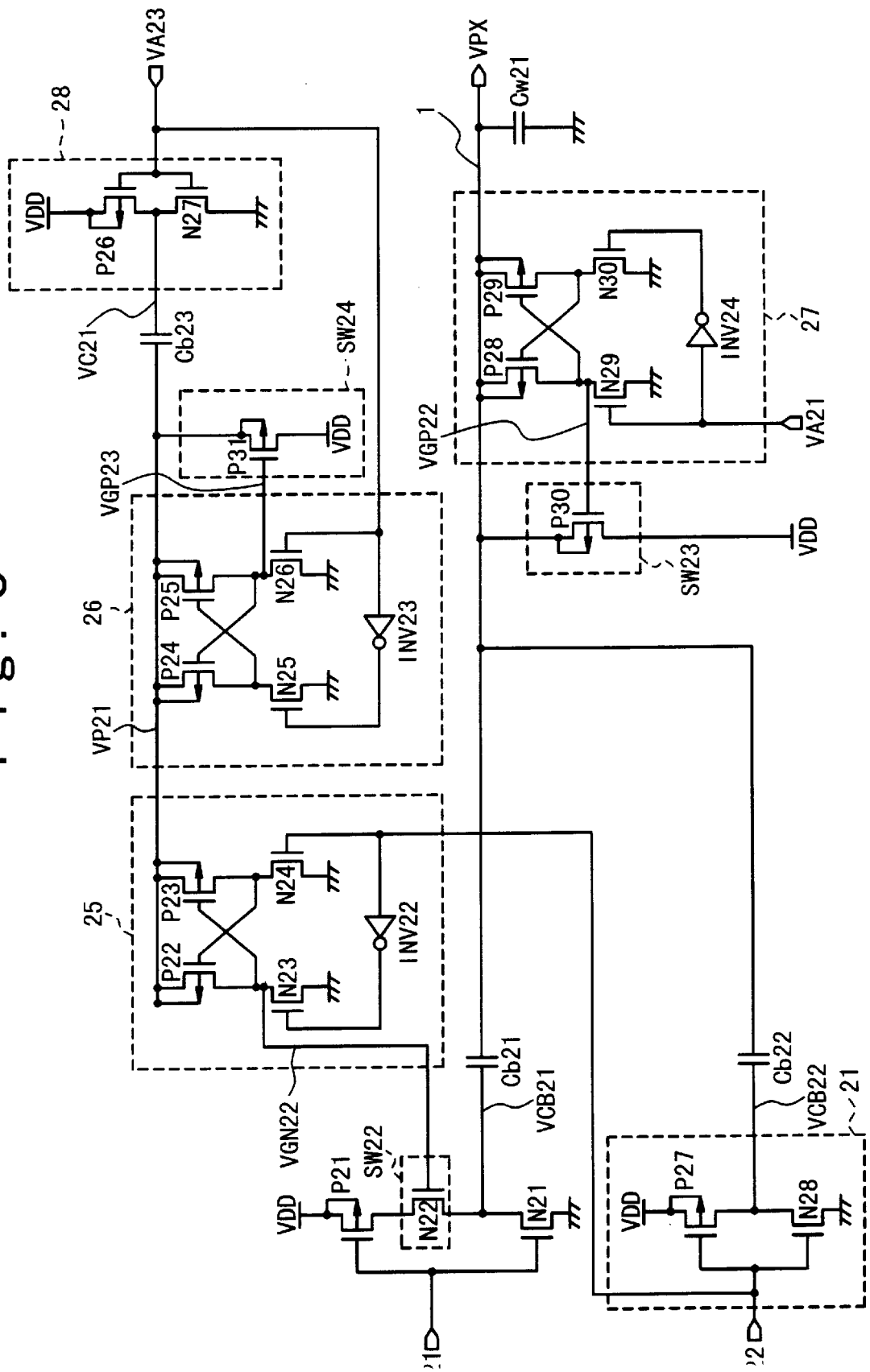
FIG. 8 is a schematic circuit diagram showing the structure of the boosting circuit according to a third embodiment of the present invention.

FIG. 8 is a block diagram showing the structure of the boosting circuit according to the third embodiment of the present invention. FIGS. 9A to 9G are timing charts at various sections of the boosting circuit shown in FIG. 8.

The basic principle in the third embodiment is the same as that of the boosting circuit shown in FIG. 6.

Referring to FIG. 8, P21 to P31 are P-channel MOS transistors, and N21 and N23 to N30 are N-channel MOS transistors. N22 is an undoped N-channel MOS transistor and INV22, INV23 and INV24 are inverters. Cb21 is a first boosting capacitor and Cb22 is a second boosting capacitor. Cb23 is a third boosting capacitor, and Cw21 is a parasitic capacitance which is parasitic to the row decoder power supply line VPX as above-mentioned. The boosting circuit in the third embodiment is further composed of a control circuit (not shown) controlling the potentials of signal VA21, VA22 and VA23.

The level shifter 25 is composed of the MOS transistors P22, P23, N23 and N24 and the inverter INV22. The level shifter 25 is a voltage converting circuit which has an output node VP21 as the power supply, VGN22 as an output signal and VA22 as an input signal. The level shifter 26 is composed of the MOS transistors P24, P25, N25 and N26 and the inverter INV23. The level shifter 26 is a voltage converting circuit which has the output node VP21 as the power supply, VGP23 as an output signal, and VA23 as an input signal. The level shifter 27 is composed of the MOS transistors P28, P29, N29 and N30 and the inverter INV24. The level shifter 27 is a voltage converting circuit which has the row decoder power supply line potential VPX as the power supply, VGP22 as an output signal, and VA21 as an input signal.

The inverter 21 is composed of the MOS transistors P27 and N28, and has the external power supply potential VDD as the power supply, VA22 as an input signal, and VCB22 as an output signal. The inverter 28 is composed of the MOS transistors P26 and N27, and has the external power supply potential VDD as the power supply, VA23 as an input signal, and VC21 as an output signal. Each of the inverters INV22, INV23 and INV24 is composed of an N-channel transistors and a P-channel transistor, and has the external power supply potential VDD as the power supply, as in the inverter 21.

The switch 22 is composed of the undoped MOS transistor N22 and is equivalent to the switch 2 shown in FIG. 4. The source of the transistor N22 is connected with the drain of the MOS transistor N21 as a node VCB21, and the drain thereof is connected with the drain of the MOS transistor P21. The MOS transistor N22 is controlled in response to the output signal VGN22 from the level shifter 25. The source of the MOS transistor N21 is connected with the GND potential, and is controlled in response to the signal VA21. The source of the MOS transistor P21 is connected with the external power supply potential VDD and is controlled in response to the signal VA21.

The switch 23 is composed of the P-channel MOS transistor P30 and is equivalent to the switch 3 shown in FIG. 4. The source of the transistor P30 is connected with the external power supply potential VDD, and the drain is connected with the row decoder power supply line 1 and is controlled in response to the output signal VGP22 from the level shifter 27.

The switch 24 is composed of the P-channel MOS transistor P31. The source of the transistor P31 is connected with the external power supply potential VDD and the drain is connected with the output node VP21, and is controlled in response to the output signal VGP23 from the level shifter 26.

The boosting capacitors Cb21 and Cb22 are equivalent to the boosting capacitors Cb1 and Cb2 shown in FIG. 4. Electrodes of the respective boosting capacitors Cb21 and Cb22 are connected with the row decoder power supply line 1 in parallel. The other electrode of Cb21 is connected with the switch 22 and the drain of the MOS transistor N21, and the other electrode of Cb22 is connected with the output node VCB22 of the inverter 21. Also, one electrode of the boosting capacitor Cb23 is connected with the output node VP21 and the other electrode is connected with the output node VC21 of the inverter 28.

The operation of the boosting circuit in the third embodiment will be described with reference to FIG. 8 and FIGS. 9A to 9G.

As shown in FIGS. 9E to 9G, the signals VA21, VA22, and VA23 are held to the high level before the time t1. Because the gates of the N-channel transistor N21 and P-channel transistor P21 are the high level, the P-channel transistor P21 is turned off and the N-channel transistor N21 is turned on. Therefore, the node VCB21 to which one electrode of the boosting capacitor Cb21 is connected is set to the conductive state with the GND potential through the N-channel transistor N21. Also, because the gates of the N-channel transistor N28 and P-channel transistor P27 are supplied with the signal VA22 in the high level, the P-channel transistor P27 is turned off and the N-channel transistor N28 is turned on. As a result, the node VCB22 of the boosting capacitor Cb22 is set to the conductive state with the GND potential through the N-channel transistor N28. Because the signal VA23 in the high level is supplied to the gates of the N-channel transistor N27 and P-channel transistor P26, the P-channel transistor P26 is turned off and the N-channel transistor N27 is turned on. As a result, the node VC21 to which one electrode of the boosting capacitor Cb23 is connected is set to the conductive state with the GND potential through the N-channel transistor N27.

Because the signal VA21 in the high level is supplied to the input of the level shifter 27, the GND potential of the inverse logic phase as the signal VA21 is outputted as the output signal VGP22. Because the signal VGP22 is supplied to the gate of the P-channel transistor P30, the P-channel transistor P30 is turned on so that the row decoder power supply line VPX is set to the conductive state with the external power supply potential VDD.

Because the signal VA23 is in the high level, the GND potential having the inverse logic phase as the signal VA23 is outputted as the output signal VGP23. Because the signal VGP23 is supplied to the gate of the P-channel transistor P31, the P-channel transistor P31 is turned on and the node VP21 is set to the conductive state with the external power supply potential VDD.

Because the signal VA22 is supplied to the input of the level shifter 25 and the signal VA22 is in the high level, the signal having the same logic level as the signal VA22 is outputted as the output signal VGN22. The signal VGN22 has the same potential level as the node VP21, i.e., the external power supply potential VDD, because the P-channel transistor P31 is turned on at this time and the node VP21 is set to the conductive state with the external power supply potential VDD.

Because the P-channel transistor P30 of the switch 23 is turned on, the row decoder power supply potential VPX is increased to be pulled up to the external power supply potential VDD. Also, the electric charge of (VDD×Cb21) is stored in the boosting capacitor Cb21 and the electric charge of (VDD×Cb22) is stored in the boosting capacitor Cb22. Also, the electric charge of (VDD×Cw21) is stored in the parasitic capacitance Cw21. Therefore, a total electric charge quantity Qt is expressed as follows:

$$Qt=\{VDD\times(Cb21+Cb22+Cw21)\}$$

Next, when the signal VA23 is switched from the high level to the GND potential at the timing of t1 shown in FIG. 9G, the GND potential is supplied to the input of the level shifter 26 and the output signal VGP23 is outputted from the level shifter 26 to have the inverse logic phase to the signal VA23 and to have the same potential as the node VP21. Because the signal VGP23 is supplied to the gate of the P-channel transistor P31, the MOS transistor P31 is turned off, so that the node VP21 is separated from the external power supply potential VDD and is set to the high impedance state.

At the same time, the signal VA23 is switched from the high level to the GND potential, so that the N-channel transistor N27 is turned off and the P-channel transistor P26 is turned on. As a result, the level of the node VC21 is increased from the GND potential to the external power supply potential VDD. As the level of the node VC21 is increased, the node VP21 is also increased from VDD to the potential of Vboost3. The potential of Vboost3 is determined based on the ratio of the value of the capacitor Cb23 and the parasitic capacitance parasitic to the node VP21. Because the parasitic capacitance is several pF, if the value of the capacitor Cb23 is about tens of pF, the value of the node VP21 is increased approximately to twice of the level of VDD. Following the potential rising of the node VP21, the level of the signal VGN22 is also increased to the potential of Vboost3.

This operation increases the potential level of the signal VGN22 which is supplied to the gate of the N-channel undoped transistor N22 functioning as the switch 22, for the time interval of t1 to t2 shown in FIG. 9D. As a result, the speed when the potential of the node VCB21 is increased from the GND potential to the external power supply potential VDD is increased. In case of the method in the second embodiment, the speed when the potential of the node VCB11 is increased from the GND potential to the external power supply potential VDD is dependent on the increase speed of the row decoder power supply potential VPX. In this way, twice of levels of the power supply potential VDD are set to the signal VGN22 which is supplied to the gate of the N-channel undoped transistor N22 for the time interval of t1 to t2.

Next, when the signal VA21 is switched from the high level to GND potential at the timing of t2 shown in FIG. 9E, the GND potential is supplied to the input of the level shifter 27 and the row decoder power supply potential VPX having the inverse logic phase as the signal VA21 is outputted as the output signal VGP22. Because the signal VGP22 is supplied to the gate of the P-channel transistor P30, the P-channel transistor P30 is turned off. As a result, the row decoder power supply line 1 is disconnected from the external power supply potential VDD so as to be set to a high impedance state.

The signal VA21 is switched from the high level to the GND potential, so that the N-channel transistor N21 is turned off and the P-channel transistor P21 is turned on. Because the signal VGN22 having the potential twice more than the level of the external power supply potential VDD are supplied to the gate of the N-channel undoped transistor N22, the node VCB21 is increased quickly from the GND potential to the external power supply potential VDD. With the increase, finally, the row decoder power supply potential VPX is increased to the potential of Vboost1. Because the total electric charge quantity is same, Qt is expressed as:

$$Qt=(Vboost1-VDD)\times Cb21+Vboost1\times(Cb22+Cw21)$$

The row decoder power supply line potential VPX for the time interval from t2 to t3 in FIG. 9C is increased to the level Vboost1, $$Vboost1=\{(2\times Cb21+Cb22+Cw21)\div(Cb21+Cb22+Cw21)\times VDD\}$$

Next, when the signal VA22 is switched from the high level to the GND potential at the timing of t3 shown in FIG. 9F, the GND potential is supplied to the input of the level shifter 25 and the GND potential having the logic phase is outputted as the output signal VGN22. Because the signal VGN22 is supplied to the gate of the N-channel undoped transistor N22, the N-channel MOS transistor N22 is turned off so that the node VCB21 is set to a high impedance state. Because the signal VA22 is switched from the high level to the GND potential, the output node VCB22 of the inverter 21 is switched from the GND potential into the external power supply potential VDD at the same time. With this switching, the row decoder power supply line potential VPX is increased from the potential of Vboost1 to the potential of Vboost2. Because the total electric charge quantity is same, Qt is expressed as follows:

$$Qt=(Vboost2-VDD)\times Cb21+Vboost2\times Cw21+(Vboost1-VDD)\times Cb22$$

For the time interval from t3 to t4 in FIG. 9C, the row decoder power supply line VPX is increased to the following level:

$$Vboost2=\{Vboost1+Cb22\div(Cb22+Cw21)\times VDD\}$$

As described above, according to the boosting circuit of the present invention, the 2-step boosting operation is carried out to output a predetermined word potential. Thus, the predetermined word potential can be outputted by use of the boosting capacitor which is smaller than that necessary in the 1-step boosting operation. In the conventional boosting circuit, when the parasitic capacitance Cw to the row decoder is 100 pF, the boosting capacitor Cb shown in FIG. 2 needs to have a capacitance equal to or more than 1500 pF in a case that the power supply voltage of 1.8 V is used and the word voltage of 3.5 V is to be outputted.

On the other hand, in the present invention, it is sufficient to allocate 200 pF and 100 pF as two boosting capacitors, respectively. In this case, the output potential VPX is 3.6 V as follows:

$$VPX(t1-t2)=(2\times Cb1+Cb2+Cw)\div(Cb1+Cb2+Cw)\times VDD \quad VPX(t2-t3)=VPX(t1-t2)+Cb2\div(Cb2+Cw)\times VDD$$

As mentioned above, although the capacitance of 1500 pF is conventionally necessity, the boosting operation can be realized by a capacitor of 300 pF in the present invention. Thus, cost reduction, a low voltage operation, a low power consumption, a high-speed access, and chip size reduction can be realized.

What is claimed is:

1. A semiconductor memory device with a boosting circuit, comprising:

a first power supply line;

a second power supply line supplying a power supply potential;

first and second boosting capacitors connected to said first power supply line; and a control circuit connecting said second power supply line to said first power supply line for a first time interval such that said first power supply line and said first and second boosting capacitors receive the power supply potential;

said control circuit connecting said first boosting capacitor to the power supply potential, creating a series connection between said first and second boosting capacitors, thereby said first boosting capacitor boosts said first power supply line and said second boosting capacitor for a second time interval after said first time interval, and said control circuit connecting said second boosting capacitor to the power supply potential, creating a series connection between said first and second boosting capacitors, thereby said second boosting capacitor boosts said first power supply line for a third time interval after said second time interval.

2. A semiconductor memory device with a boosting circuit, comprising:

a first power supply line;

a second power supply line supplying a power supply potential;

first and second boosting capacitors connected to said first power supply line; and a control circuit connecting said second power supply line to said first power supply line for a first time interval such that said first power supply line and said first and second boosting capacitors receive the power supply potential;

said control circuit connecting said first boosting capacitor to the power supply potential, thereby said first boosting capacitor boosts said first power supply line and said second boosting capacitor for a second time interval, after said first time interval, and said control circuit connecting said second boosting capacitor to the power supply, thereby said second boosting capacitor boosts said first power supply line for a third time interval after said second time interval, wherein said control circuit includes a first switch provided between said first power supply line and said second power supply line, said control circuit controlling said first switch to connect said second power supply line to said first power supply line for said first time interval.

3. A semiconductor memory device with a boosting circuit, comprising:

a first power supply line;

a second power supply line supplying a power supply potential;

first and second boosting capacitors connected to said first power supply line; and a control circuit connecting said second power supply line to said first power supply line for a first time interval such that said first power supply line and said first and second boosting capacitors receive the power supply potential;

said control circuit connecting said first boosting capacitor to the power supply potential, thereby said first boosting capacitor boosts said first power supply line and said second boosting capacitor for a second time interval, after said first time interval, and said control circuit connecting said second boosting capacitor to the power supply, thereby said second boosting capacitor boosts said first power supply line for a third time interval after said second time interval, wherein said control circuit includes a second switch provided between said first boosting capacitor and a first node, said control circuit controlling said second switch to connect said first boosting capacitor to said first node for said first and second time intervals, and to disconnect said first boosting capacitor from said first node for said third time interval, said control circuit further setting said first node to a ground potential for said first time interval and to said power supply potential for said second time interval.

4. A semiconductor memory device with a boosting circuit, comprising:

a first power supply line;

a second power supply line supplying a power supply potential;

first and second boosting capacitors connected to said first power supply line; and a control circuit connecting said second power supply line to said first power supply line for a first time interval such that said first power supply line and said first and second boosting capacitors receive the power supply potential;

said control circuit connecting said first boosting capacitor to the power supply potential, thereby said first boosting capacitor boosts said first power supply line and said second boosting capacitor for a second time interval, after said first time interval, and said control circuit connecting said second boosting capacitor to the power supply, thereby said second boosting capacitor boosts said first power supply line for a third time interval after said second time interval, wherein said control circuit includes a second node connected to said second boosting capacitor, said control circuit setting said second node to a ground potential for said first and second time intervals and to said power supply potential for said third time interval.

5. A semiconductor memory device with a boosting circuit, comprising:

a first power supply line;

a second power supply line supplying a power supply potential;

first and second boosting capacitors connected to said first power supply line; and a control circuit connecting said second power supply line to said first power supply line for a first time interval such that said first power supply line and said first and second boosting capacitors receive the power supply potential;

said control circuit connecting said first boosting capacitor to the power supply potential, thereby said first boosting capacitor boosts said first power supply line and said second boosting capacitor for a second time interval, after said first time interval, and said control circuit connecting said second boosting capacitor to the power supply, thereby said second boosting capacitor boosts said first power supply line for a third time interval after said second time interval, wherein said control circuit further comprises:

a control signal generating circuit which generates a first control signal and controls a first switching element connected between said first and second power supply lines in response to a first switching signal; and a first signal generating circuit which generates said first switching signal in response to said first control signal and provides an active first switching signal during said first time interval.

6. A boosting circuit according to claim 5, wherein said first signal generating circuit is connected to said first power supply line as a power supply line.

7. A boosting circuit according to claim 6, wherein said first signal generating circuit includes a flip-flop circuit.

8. A boosting circuit according to claim 5, wherein said control circuit further comprising:

a first inverter connected at its output to said second boosting capacitor, and said control signal generating circuit which generates a second control signal of said power supply potential as input to said first inverter during said third time interval.

9. A boosting circuit according to claim 8, wherein said control circuit further comprising:

a second inverter with a second switch element, having an output of said second inverter connected to said first boosting capacitor, and wherein said second switching element is switched in response to a second switching signal to connect said output of said second inverter to said power supply potential; and a second signal generating circuit which generates said second switching signal in response to said second control signal and provides an active second switching signal during said second and third time intervals, said control circuit supplying said first control signal to an input of said second inverter.

10. A boosting circuit according to claim 9, wherein said second signal generating circuit is connected to said first power supply line as a power supply line.

11. A boosting circuit according to claim 10, wherein said second signal generating circuit includes a flip-flop circuit.

12. A boosting circuit according to claim 8, wherein said control signal generating circuit generates a third control signal, and a third signal generating circuit comprises:

a third power supply line;

a charging circuit which charges said third power supply line higher than said power supply potential in response to said third control signal, the charging is performed during a fourth time interval occurring at the end of said first time interval and immediately before the start of said second time interval; and said third signal generating circuit, connected to said third power supply line, generates said third switching signal in response to said third control signal and provides an active third switching signal during said second and third time intervals.

13. A boosting circuit according to claim 12, wherein said third generating circuit includes a flip-flop circuit.

14. A boosting circuit according to claim 12, wherein said charging circuit includes:
- a third boosting capacitor connected to said third power supply line;
- a third switching element connecting said second power supply line to said third power supply line in response to a third switching signal;
- a third inverter connected at an output to said third boosting capacitor, driving said third boosting capacitor in response to said third control signal such that said third power supply line is boosted higher than said power supply potential for said second and third time intervals; and
- a fourth signal generating circuit connected to said third power supply line, generating said third switching signal in response to said third control signal such that said third switching signal is active for said first time interval and a fourth time interval.

15. A method of boosting a voltage, comprising:
- charging a first power supply line and first and second boosting capacitors from a second power supply line having a power supply potential, for a first time interval;
- applying the power supply potential to said first boosting capacitor to create a series connection between said first and second boosting capacitors, and charging said first power supply line and said second boosting capacitor with said first boosting capacitor for a second time interval after said first time interval;
- operatively disconnecting said first boosting capacitor from the power supply potential; and
- applying the power supply potential to said second boosting capacitor to create a series connection between said first and second boosting capacitors, and charging said first power supply line with said second boosting capacitor for a third time interval, after said second time interval.

* * * * *